(12) United States Patent
Han et al.

(10) Patent No.: US 6,490,223 B1
(45) Date of Patent: Dec. 3, 2002

(54) INTEGRATED CIRCUIT CAPABLE OF BEING BURN-IN TESTED USING AN ALTERNATING CURRENT STRESS AND A TESTING METHOD USING THE SAME

(75) Inventors: Sang-jib Han, Suwon (KR); Du-eung Kim, Suwon (KR); Choong-keun Kwak, Suwon (KR); Yun-seung Shin, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/614,783

(22) Filed: Jul. 12, 2000

(30) Foreign Application Priority Data

Jul. 12, 1999 (KR) .............................. 99-27991

(51) Int. Cl.[7] .................................. G11C 8/00
(52) U.S. Cl. ................... 365/233; 365/201; 365/230.01
(58) Field of Search ........................... 365/201, 230.01, 365/230.08, 233, 239, 240

(56) References Cited

U.S. PATENT DOCUMENTS

| | | | |
|---|---|---|---|
| 4,821,238 A | * | 4/1989 | Tematsu .................... 365/201 |
| 5,294,776 A | | 3/1994 | Furuyama |
| 5,619,462 A | | 4/1997 | McClure |
| 5,654,588 A | | 8/1997 | Dasse et al. |
| 5,861,660 A | | 1/1999 | McClure |
| 5,883,008 A | | 3/1999 | McClure |
| 6,034,880 A | * | 3/2000 | Chen et al. ..................... 365/96 |
| 6,065,143 A | * | 5/2000 | Yamasaki et al. ........... 365/201 |
| 6,084,809 A | * | 7/2000 | Wada .......................... 365/190 |
| 6,189,119 B1 | * | 2/2001 | Kitaoka et al. ............. 714/718 |
| 6,286,118 B1 | * | 9/2001 | Churchill et al. ........... 714/726 |

FOREIGN PATENT DOCUMENTS

EP 574002 12/1993

* cited by examiner

*Primary Examiner*—Richard Elms
*Assistant Examiner*—VanThu Nguyen
(74) *Attorney, Agent, or Firm*—Marger Johnson & McCollom, P.C.

(57) ABSTRACT

An integrated circuit that is capable of being burn-in tested with an AC stress and a testing method using the same are provided. The integrated circuit includes an address transforming means and a data generating means. The address transforming means transforms the addresses of the memory cell selected and generates an address signal responsive to a clock signal. The data generating means generates a data signal that alternates between a first state and a second state responsive to the clock signal and provides the data signal to the selected memory cell. The integrated circuit includes a switch for coupling the test supply line to the normal supply line during testing and intercepting the test supply line from the normal supply line during normal operations responsive to a control signal. The integrated circuit of the present invention allows a wafer burn-in test by sequentially and repeatedly applying the AC stress to all the memory cells.

15 Claims, 4 Drawing Sheets

INTEGRATED CIRCUIT CAPABLE OF BEING BURN-IN TESTED USING AN ALTERNATING CURRENT STRESS AND A TESTING METHOD USING THE SAME

BACKGROUND OF THE INVENTION

1. Field of the Invention

The present invention relates to an integrated circuit and, more particularly to an integrated circuit for performing a burn-in test at the wafer level of semiconductor production and a testing method using the same.

2. Description of the Related Art

Integrated circuits including DRAM and SRAM memory cells often fail due to defects in the manufacturing process. To screen such failures, a burn-in test is performed on the integrated circuits. In the burn-in test, a write operation is repeatedly performed under a high voltage and at a high temperature. The burn-in test is performed after the integrated circuit is packaged. In other words, circuit chips are electrically tested in a wafer state during manufacturing. The chips that pass the wafer test are packaged and the burn-in tested. The burn-in test is often called package burn-in (PBI).

The burn-in time increases as the integration level of the circuit increases. Additionally, integrated circuits are made with a wider variety of functions and pins, the socket density of a burn-in board is reduced. Accordingly, productivity deteriorates. Also, package yield worsens since initial failure is not appropriately detected at the wafer level.

Various water burn-in level methods have been developed to address the above-related problems. One such method is described in U.S. Pat. No. 5,294,776 to Kuruyama assigned to Kabushiki Kaisha Toshiba of Japan. There, all dies in a wafer are electronically stressed during burn-in by applying a higher than normal supply voltage Vcc and ground voltage Vss. In the Furuyama patent the stress applied is direct current (DC) voltage. This is because an alternating current voltage cannot be reliably sequentially and repeatedly applied to all of the memory cells.

SUMMARY OF THE INVENTION

It is an object of the present invention to provide an integrated circuit capable of being effectively burn-in tested by reliably sequentially and repeatedly applying an AC stress to all memory cells contained therein.

There is provided an integrated circuit including a plurality of memory cells arranged in rows and columns and having at least one test mode. The integrated circuit according to the present invention comprises an address transforming means and a data generating means. The address transforming means transforms the addresses of the memory cell selected and generates an address signal responsive to a clock signal. The data generating means generates a data signal that alternates between a first state and a second state responsive to the clock signal and provides the data signal to the selected memory cell.

Also provided is a semiconductor wafer including a plurality of dies arranged in columns and rows, each die includes a plurality of memory cells, a normal and at least one test mode, and a scribe lane positioned between adjacent dies. A test supply line for receiving an external test power supply in the test operation mode is positioned in the scribe lane. Each die comprises a switch for coupling the test supply line to the normal supply line in the test mode and uncoupling the test supply line from the normal supply line in the normal mode, responsive to a control signal. The voltage level of the data provided to the memory cell is controlled by the voltage level of the normal supply line.

Also, provided is a method for testing a plurality of integrated circuit dies arranged in rows and columns on a wafer, each die including a plurality of memory cells. The method comprises the steps of counting a clock signal, generating an address signal for a selected memory cell responsive to the counted clock signal, generating a data signal responsive to the clock signal, and providing the data signal to the selected memory cell.

The integrated circuit and the semiconductor wafer of the present invention, allow effective wafer burn-in testing by sequentially and repeatedly applying the AC stress to a plurality of memory cells while minimizing current consumption.

BRIEF DESCRIPTION OF THE DRAWINGS

The foregoing and other objects, features, and advantages of the present invention will become more readily apparent by describing in detail a preferred embodiment with reference to the attached drawings.

DESCRIPTION OF THE PREFERRED EMBODIMENTS

The present invention will now be described more fully with reference to the accompanying drawings, in which preferred embodiments of the invention are shown. This invention might, however, be embodied in many different forms and should not be construed as being limited to the embodiments set forth herein. Rather, these embodiments are exemplary provided for thoroughness and completeness and to fully convey the concept of the invention to those skilled in the art.

Figure 1:
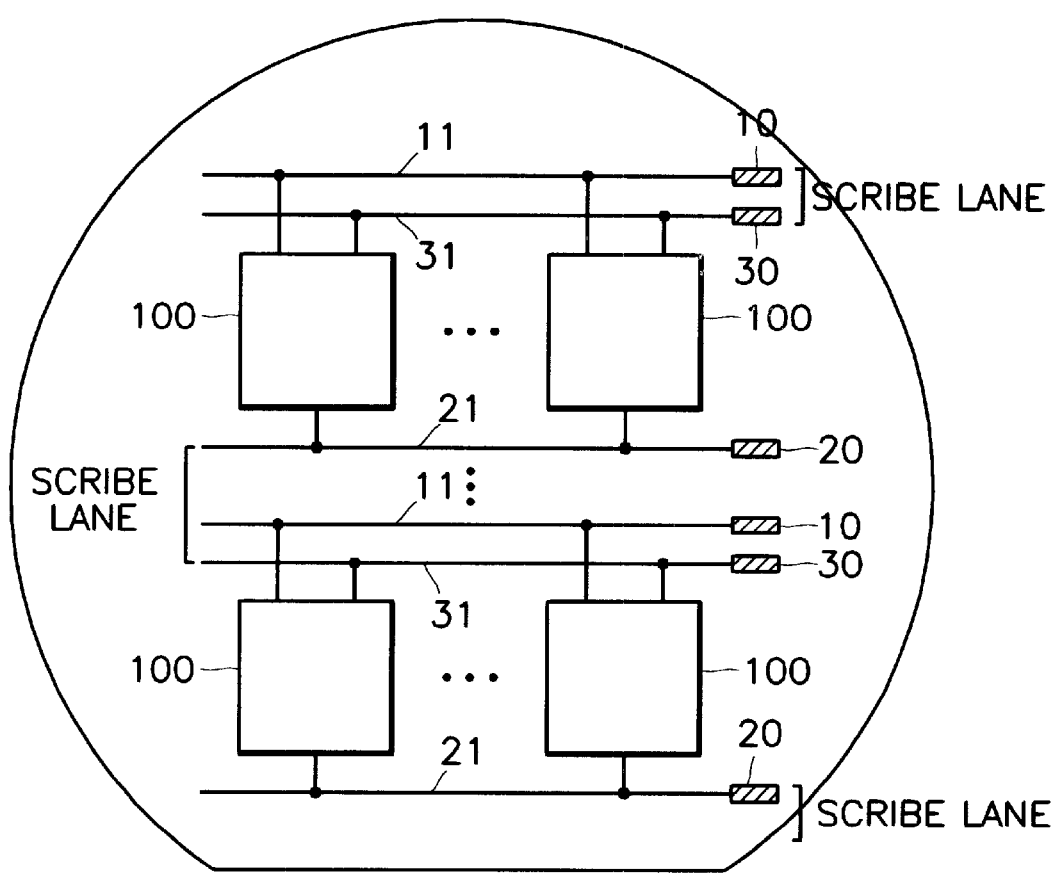
FIG. 1 is a block diagram of a wafer including integrated circuits capable of being burn-in tested with an AC stress according to one embodiment of the present invention.

FIG. 1 is a block diagram of a wafer including integrated circuits capable of being burn-in tested with an AC stress according to an embodiment of the present invention. Any number or type of semiconductor products including a plurality of memory cells can be used as an integrated circuit 100 shown in FIG. 1. For purposes of the subsequent description, however, the integrated circuit 100 will be explained using a memory chip having a plurality of memory cells (not shown). Any number and type of test mode can be applied to the integrated circuit 100. However, a burn-in test will be described for the convenience of explanation.

Referring to FIG. 1, memory chips are arranged in rows and columns on a semiconductor wafer. Scribe lane regions, sawed during the assembly of packages, exist between the memory chips. Burn-in supply terminals 10, burn-in supply lines 11, clock signal terminals 30, and clock signals lines 31, burn-in ground terminals 20, and burn-in ground lines 21 are wired in the scribe lane region.

The memory chips located in the same row are commonly connected to the burn-in supply lines 11. Therefore, a common burn-in supply line is formed in the row direction on the semiconductor wafer. The voltages on the specific burn-in supply lines 11 can be simultaneously transmitted to the supply lines of the memory chips located in the same row. The burn-in ground lines 21 and the clock signal lines 31 are positioned in the same method as the burn-in supply lines 11. When an electric potential is applied to the burn-in supply line 11, the clock signal line 31, and the burn-in ground line 21 corresponding to specific rows, the electric potential is applied substantially simultaneously to all the memory chips on the corresponding row. Also, when a burn-in test mode is applied to a memory chip on a specific row, the burn-in test mode is applied to all the memory chips on the same row.

In general, the number of channels that can be simultaneously tested is limited by the test equipment. Therefore, only one wafer burn-in supply terminal 10, one burn-in ground terminal 20, and one clock signal terminal 30 that provide addresses and data for selecting memory cells are used in order to minimize the number of channels that are tested on one row.

If the electric potential can be simultaneously applied to various rows within a range allowed by the channels of the test equipment, it is possible to perform the burn-in test with respect to all the memory chips on the semiconductor wafer without additional package burn-in costs. Accordingly, manufacturing costs are reduced, reliability is increased, and productivity is increased.

Figure 2:
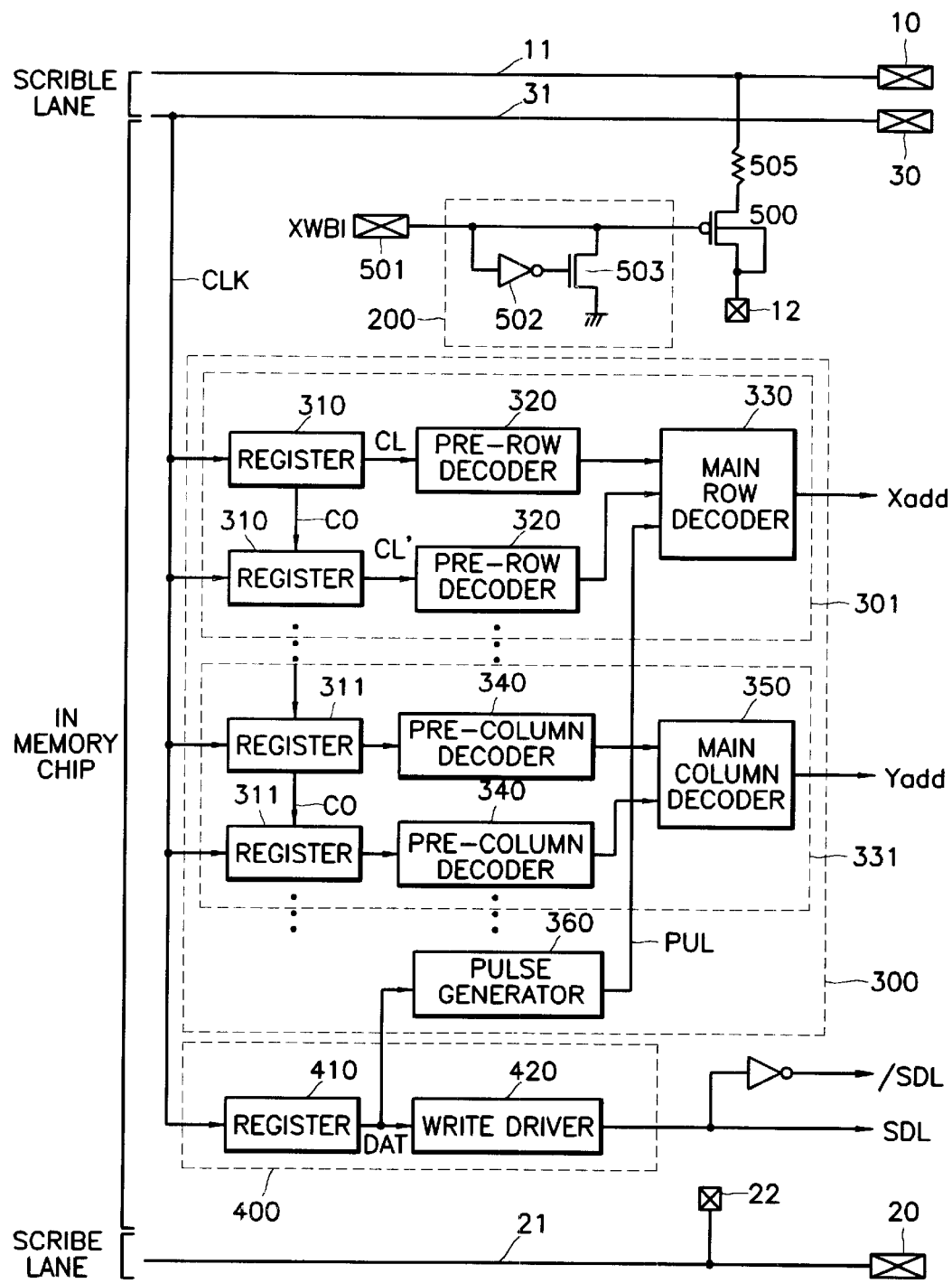
FIG. 2 is a block diagram of voltage bussing lines internal to the integrated circuits according to an embodiment of the present invention.
Figure 3:
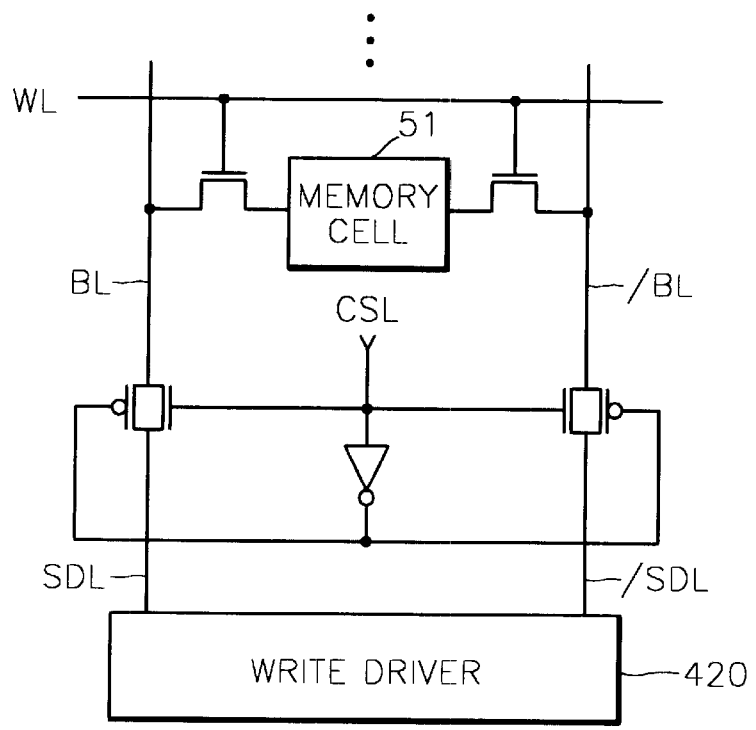
FIG. 3 is a block diagram of a memory cell and related to signals.

FIG. 2 shows bussing lines that exist in the internal circuits of the memory chips capable of being AC stressed according to one embodiment of the present invention. The bussing lines also exist in the scribe lanes. FIG. 3 shows a memory cell for storing data in the memory chip and related signals.

Referring to FIG. 2, each memory chip includes an address transforming means 300 and a data generating means 400. The address transforming means 300 sequentially changes addresses responsive to a clock signal CLK input through a clock signal line 31. The address transforming means 300 generates a row address signal Xadd and a column address signal Yadd for selecting the memory cells 51 (FIG. 3). The row address signal Xadd activates the word line WL (FIG. 3) of the memory cells arranged on the same row in the memory chip. The column address signal Yadd activates the column selection line CSL. Accordingly, the data provided to the data input and output line pair SDL and /SDL (refer to FIG. 3) is provided to the memory cell (FIG. 3) selected by the row and column address signals Xadd and Yadd. The address transforming means 300 includes a row address transforming means 301 and a column address transforming means 331. The row address transforming means 301 generates the row address signal Xadd responsive to the clock signal CLK. The row address transforming means 301 includes a row counter and a row decoder. The row counter includes a plurality of row registers 310 and counts the number of activations of the clock signal CLK. The row decoder includes pre row decoders 320-; and a main row decoder 330. The decoder sequentially changes Xadd the row address according to the number of activations of the clock signal CLK counted by the plurality of row registers 310.

The row registers 310 are serially connected and respond to the clock signal CLK. The row registers 310 receive the output signal C0 of the previous row register as a CARRY input. The pre row decoders 320 decode the signals CL and CL', . . . output from corresponding row registers 310. The main row decoder 330 decodes the output signals of the pre row decoders 320-; and generates the row address signal Xadd. The main row decoder 330 is controlled by a pulse signal PUL generated by a pulse generator 360. The activation width of the selected row address signal Xadd corresponds to the activation width of the pulse signal PUL.

The column address transforming means 331 includes a column counter and a column decoder. The column counter counts the number of activations of the clock signal CLK generated after the CARRY of the last row register is generated. The column decoder includes precolumn decoders 340-; and a main column decoder 350. The column decoder sequentially changes the column address Yadd according to the number of activations of the clock signal CLK counted by the column counter.

The column registers 311 are serially connected and respond to the clock signal CLK. The first column register 311 receives the output signal of the last row register 310 as the CARRY and responds to the clock signal CLK. The column registers 311 receive the output signals of the previous column registers as the CARRY and respond to the clock signal CLK. The pre-column decoders 340 decode the output signal of the corresponding column registers 311. The main column decoder 350 decodes the output signals of the pre-column decoders 340 and generates the column address signal Yadd.

A data generating means 400 alternately generates data signal logic having a high or logic low responsive to the clock signal CLK. The data signals generated by the data generating means 400 are provided to the data input and output line pair SDL and /SDL (refer also to FIG. 3). The data signals provided to the data input and output line pair SDL and /SDL are provided to the memory device 51 selected by the row and column address signals Xadd and Yadd.

A data generating means 400 alternately generates data signal logic having a high or logic low responsive to the clock signal CLK. The data signals generated by the data generating means 400 are provided to the data input and output line pair SDL and /SDL (refer also to FIG. 3). The data signals provided to the data input and output line pair SDL and /SDL are provided to the memory cell 51 selected by the row and column address signals Xadd and Yadd.

The above-mentioned address transforming means 300 preferably further includes a pulse generator 360. The pulse generator 360 generates the pulse signal PUL that responds to the transition of the data signal DAT. The pulse signal PUL is provided to the main row decoder 330 and controls the activation width of the row address signal Xadd.

The pulse generator 360 is used in a preferred embodiment of the present invention for the following reasons. When performing the burn-in test on the semiconductor wafer, a power supply is applied to the burn-in supply terminal 10 and a ground voltage Vss is applied to the burn-in ground terminal 20. A uniform clock signal CLK is applied to the clock signal terminal 30. At this time, excessive current may flow because many chips are simultaneously burned-in. To minimize the operating current of the memory chips, a pulsed word line is preferably used. The pulse generator 360 generates the pulsed word line.

Figure 4:
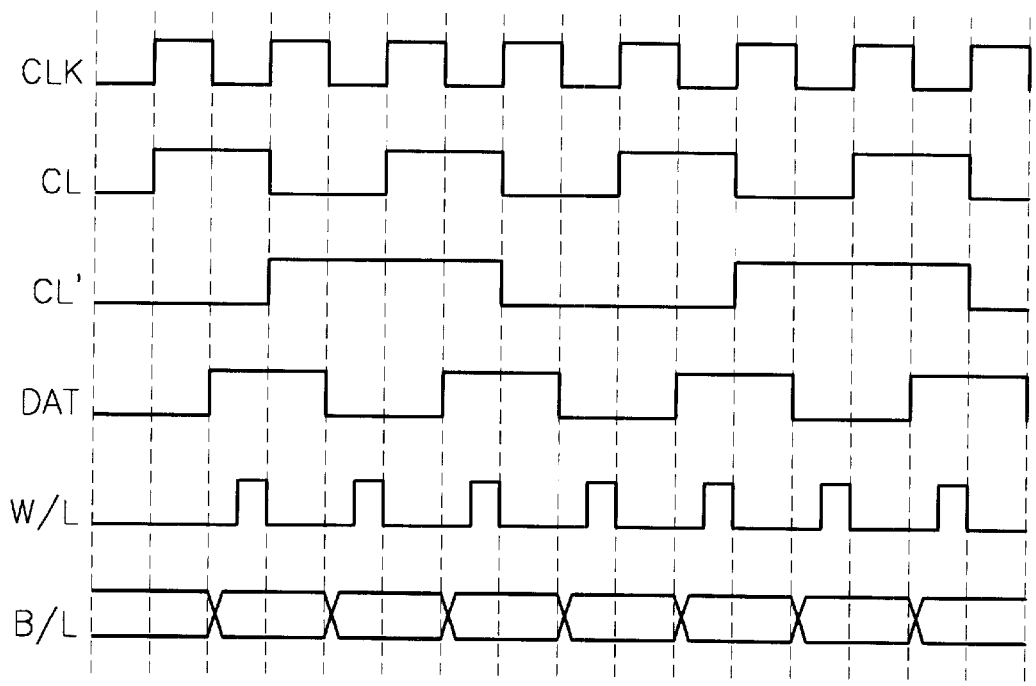
FIG. 4 is a timing diagram of signals used to control the integrated circuits of the present invention.

FIG. 4 is the timing diagram of the main signals of the internal circuit of the memory chip shown in FIG. 2. After the supply voltage and the ground voltage are applied to the burn-in supply terminal 10 and the burn-in ground terminal 20, respectively, the clock signal CLK for performing the wafer burn-in test is applied. In the first register CL corresponding to the clock signal CLK is input to the pre-row decoder 320 and the signal (the pre-row decode 320 corresponds to the row register 310) C0 that is the CARRY of the first row register 310 is transmitted to the second row register 310. The second row register 310 generates an output signal CL' having a period that is double the period of the first row register due to the CARRY signal C0 received from the first row register 310. It is possible to select row and column addresses by the combination of the signals generated by the row registers 310. Preferably, address information on the memory cell applied to the row and column registers 310 and 311 and selected by the clock signal CLK is sequentially generated. The address information signals generated by the row and column registers 310 and 311 are respectively transmitted to the row decoder 330 and the main decoder 350 and activate selected word lines WLs and column selection lines CSLs.

The data register 410 operates in much the same way as the row and column registers 310 and 311. However, the transition direction of the clock signal CLK to which the data register 410 responds is different from the transition direction of the clock signal CLK to which the row and column registers 310 and 311 respond. For example, if the row and column registers 310 and 311 respond to the rising edge of the clock signal CLK then the data register 410 responds to the falling edge of the clock signal CLK.

The data signal DAT generated by the data register 410 is transmitted to the data input and output line pair SDL and /SDL by the write driver 420 which, in turn, is transmitted to the bit line.

The pulse generator 360 generates the pulse signal PUL having a short activation width responsive to the transition of the data signal DAT. The pulse signal PUL is applied to the main row decoder 330 that, in turn, activates the word line. Therefore, the pulsed word line is turned on when the data signal DAT transitions.

Referring to FIG. 2, a switch 500 for controlling the burn-in test mode at the wafer level is further included inside the memory chip according to the preferred embodiment of the present invention. In the preferred embodiment of the present invention, the switch 500 is implemented in the memory chip as follows. Namely, the burn-in supply line 11 and the burn-in ground line 21 used during the wafer burn-in test are formed on the scribe lanes on the outer block of the memory-chip. When a normal operation is performed at the wafer level, the switch 500 is helpful in reducing failures due to shorts.

The switch 500 can be realized by a PMOS transistor that responds to a control signal XWBI applied to a control signal terminal 501. Namely, in the burn-in test operation mode, the switch 500 is turned on when the control signal XWBI is in a logic low state. During the burn-in test, the burn-in supply line 11 is coupled to the normal supply terminal 12, which, in turn, is coupled to a normal supply line (not shown). During normal operation, however, the control signal XWBI is at a logic high state and the switch 500 is turned off. Therefore, during the normal operation, the burn-in supply line 11 is cut off from the normal supply line (not shown).

According to a preferable embodiment, a controller 200 for latching the control signal XWBI input through a control signal terminal 501 is further included.

The normal supply terminal 12 that supplies power during the operation of the memory chip is the main power supply terminal of the memory chip bonded by the supply voltage Vdd during the package assembly. The control signal terminal 501 is bonded by the supply voltage Vdd during the normal operation or the package assembly.

A resistor 505 might further be included between the burn-in supply line 11 and the switch 500. In the present embodiment, the resistor 505 prevents excessive current from flowing when a short is generated inside the memory chip. Namely, the bulk of the PMOS transistor that forms the switch 500 is coupled to the normal supply terminal 12. Therefore, when the normal supply line (not shown) connected to the normal supply terminal 12 is shorted from the normal ground line (not shown) coupled to a normal ground terminal 22 in the memory chip, forward bias is formed between the burn-in supply line 11 and the normal supply line. Such high consumption of current can exceed the limitation of the current consumption of the wafer burn-in equipment or the excessive current deteriorates the reliability of a power metal line for burning-in the wafer.

The resistor 505 formed between the burn-in supply line 11 and the MOS transistor forming the switch 500 lowers the current that flows when the short is generated inside the memory chip. At this time, the sheet resistance of the resistor 505 is preferably larger than the sheet resistance of the burn-in supply line 11. Reference numerals 20 and 21 denote the burn-in ground terminal and the burn-in ground line, respectively. Reference numeral 22 denotes the normal ground terminal.

Figure 5:
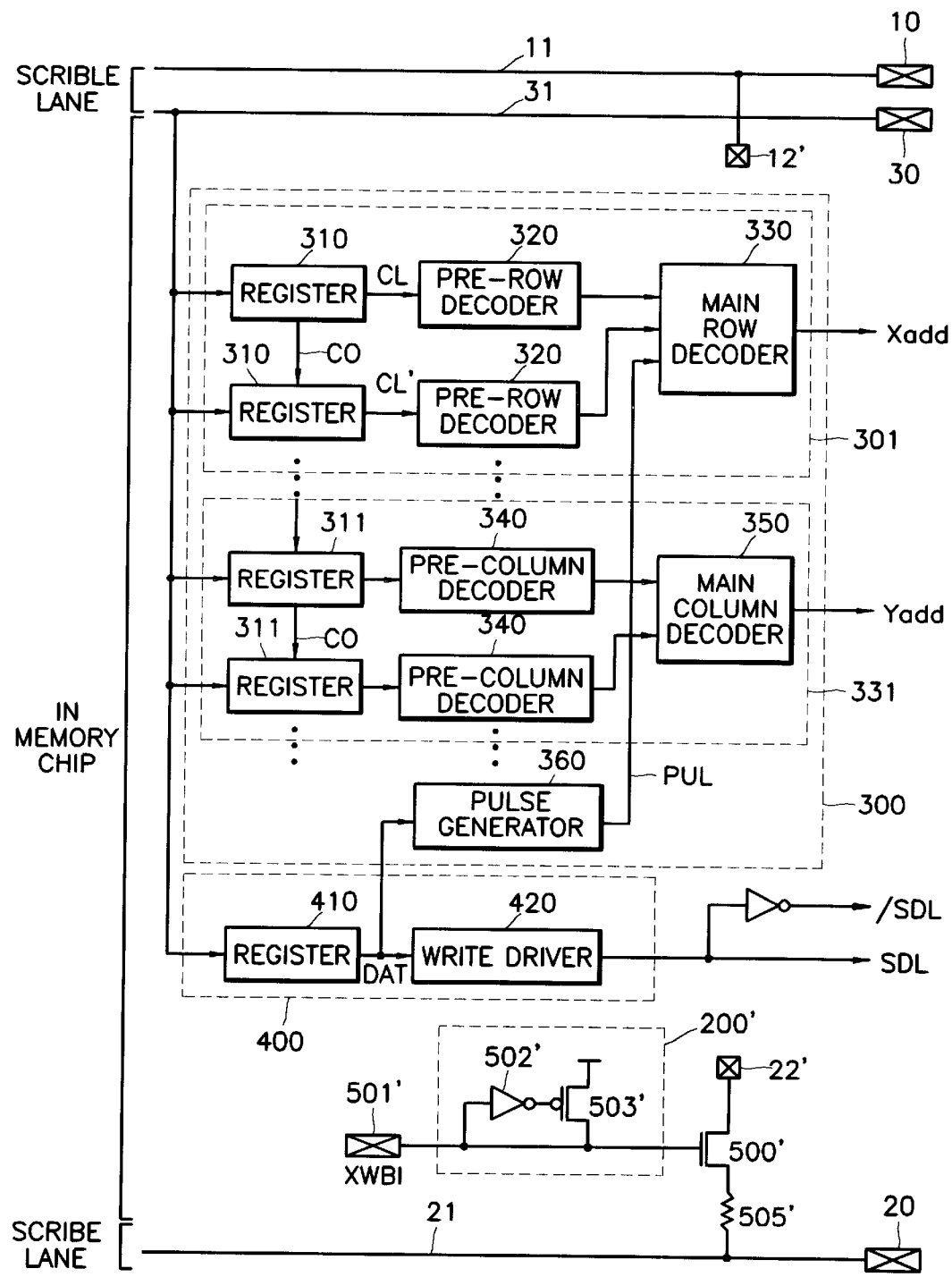
FIG. 5 is a block diagram of voltage bussing lines internal to the integrated circuits according to another embodiment of the present invention.

FIG. 5 shows the voltage bussing line that exists in the internal circuit of the memory chip able to be AC stressed according to another embodiment of the present invention. The bussing line also exists in the scribe lane, which is a modification of FIG. 2. The embodiment shown in FIG. 5 is almost the same as the embodiment shown in FIG. 2. However, the switch 500 is coupled to the burn-in supply line 11 and the normal supply line (not shown) in the embodiment of FIG. 2 and a switch 500' is coupled between the burn-in ground line 21 and the normal supply line (not shown) in the embodiment of FIG. 5. Only this difference will be described in further detail.

The switch 500' can be realized by an NMOS transistor that responds to the control signal XWBI applied to a control signal terminal 501'. In the embodiment of FIG. 5, the NMOS transistor 500 is turned on when the control signal XWBI is in a logic high state in the burn-in test operation mode. Therefore, the burn-in ground line 21 is connected to a normal ground terminal 22', which, in turn, is connected to the normal ground line (not shown). During normal operation, the control signal XWBI is in a logic low state and the switch 500' is turned off. Therefore, during the normal operation, the burn-in ground line 21 is cut off from the normal supply line (not shown). Like in the embodiment of FIG. 5, the controller 200' for latching the control signal XWBI input through the control signal terminal 501' is further included in the embodiment of FIG. 5.

The normal ground terminal 22' that supplies the ground voltage during the operation of the memory chip is the main ground terminal of the memory chip bonded to the ground voltage Vss during the assembly of a package. The control signal terminal 501' is bonded to the ground voltage Vss during the normal operation or the assembly of the package.

A resistor 505' is further included between the burn-in ground line 21 and the switch 500'. The resistor 505' prevents excessive current from flowing when a short is generated inside the memory chip.

According to the integrated circuit and the semiconductor wafer of the present invention, it is possible to perform the effective wafer burn-in test by sequentially and repeatedly applying the AC stress on the plurality of memory cells and to minimize the consumption of current. The present invention remarkably improves productivity and effectiveness by arranging the supply lines and ground lines for performing the burn-in test in the scribe lanes that are not used in the main chip.

While this invention has been particularly shown and described with reference to preferred embodiments thereof, it will be understood by those skilled in the art that various modifications in form and details may be made therein without departing from the spirit and scope of the invention as defined by the appended claims.

What is claimed is:

1. An integrated circuit including a plurality of memory cells arranged in rows and columns and having at least one test operation mode, the integrated circuit comprising:
    an address transforming means for generating an address signal of a selected memory cell responsive to a clock signal;
    a data generating means for generating a data signal responsive to the clock signal and providing the data signal to the selected memory cell; and
    a pulse generator for generating a pulse signal responsive to the data signal, the pulse signal having a width that is substantially the same as a width of the address signal.

2. The integrated circuit of claim 1 wherein the address transforming means comprises:
    a row address transforming means for generating a row address of the selected memory cell responsive to the clock signal; and
    a column address transforming means for generating a column address of the selected memory cell responsive to the clock signal.

3. The integrated circuit of claim 1 wherein the clock signal is externally input to the integrated circuit.

4. The integrated circuit of claim 1 wherein the at least one test operation mode is a burn-in test mode.

5. An integrated circuit including a plurality of memory cells arranged in rows and columns and having at least one test operation mode, the integrated circuit comprising:
    an address transforming means for generating an address of a selected memory cell responsive to a clock signal;
    a data generating means for generating a data signal responsive to the clock signal and providing the data signal to the selected memory cell; and
    a pulse generator for generating a pulse signal responsive to the data signal, the pulse signal having a width that is substantially the same as a width of a row address signal;
    wherein the address transforming means comprises:
        a row address transforming means for generating a row address of the selected memory cell responsive to the clock signal; and
        a column address transforming means for generating a column address of the selected memory cell responsive to the clock signal;
    wherein the data generating means comprises:
        a data register for generating a data signal that alternates between a first and second state responsive to the clock signal; and
        a write driver for driving the data signal and providing the driven data signal to selected memory cell.

6. The integrated circuit of claim 5 wherein the row address transforming means comprises:
    a row counter for counting clock signal activations; and
    a row decoder for sequentially changing the row address according to the clock signal activations counted by the row counter.

7. The integrated circuit of claim 6 wherein the row counter comprises a plurality of serially connected row registers and wherein a first row register responds to the clock signal and wherein subsequent row registers receive an output signal of the previous row register as a CARRY signal responsive to the clock signal.

8. The integrated circuit of claim 7 wherein the row decoder comprises:
    a plurality of pre-row decoders corresponding to the plurality of row registers for decoding output signals of corresponding row registers; and
    a main row decoder for generating the row address by decoding output signals of the pre-row decoders.

9. The integrated circuit of claim 7 wherein the column address transforming means comprises:
    a column counter for counting activations of the clock signal after generating a CARRY signal of a last row register; and
    a column decoder for sequentially changing the column address according to the clock signal activations counted by the column counter.

10. The integrated circuit of claim 9:
    wherein the column counter comprises a plurality of serially connected column registers;
    wherein a first column register receives the output signal of a last row register as a CARRY signal responsive to the clock signal; and
    wherein remaining column registers receive the output signal of a previous column registers as the CARRY signal responsive to the clock signal.

11. The integrated circuit of claim 10 wherein the column decoder comprises:
    a plurality of pre-column decoders corresponding to the plurality of column registers for decoding output signals of corresponding column registers; and
    a main column decoder for generating the column address by decoding output signals of the pre-row decoders.

12. An integrated circuit including a plurality of memory cells arranged in rows and columns and having at least one test operation mode, the integrated circuit comprising:
    an address transforming means for generating an address of a selected memory cell responsive to a clock signal; and
    a data generating means for generating a data signal responsive to the clock signal and providing the data signal to the selected memory cell;
    wherein the data generating means includes a data register for generating a data signal that alternates between a first and second state responsive to the clock signal;
    wherein the address transforming means comprises:
        a row address transforming means for generating a row address of the selected memory cell responsive to the clock signal; and
        a column address transforming means for generating a column address of the selected memory cell responsive to the clock signal; and
        wherein the column address transforming means comprises:
            a column counter for counting activations of the clock signal; and
            a column decoder for sequentially changing column address according to the clock signal activations counted by the column counter responsive to a pulse signal.

13. A method for testing a plurality of integrate circuit dies arranged in rows and columns on a wafer, each die including a plurality of memory cells, comprising:

(a) counting a clock signal;

(b) generating an address signal of a selected memory cell responsive to the counted clock signal;

(c) generating a data signal alternating between a first and second state responsive to the clock signal;

(d) providing the data signal to the selected memory cell; and (e) generating a pulse signal responsive to the data signal, the pulse signal having a width that is substantially the same as a width of the address signal.

14. The method of claim 13 wherein counting a clock signal includes:

(a1) counting the clock signal and sequentially changing row addresses; and (a2) counting the clock signal after sequentially changing the row addresses.

15. The method of claim 13 wherein the test mode is a burn-in test mode.

* * * * *

UNITED STATES PATENT AND TRADEMARK OFFICE
CERTIFICATE OF CORRECTION

PATENT NO.    : 6,490,223 B1
DATED         : December 3, 2002
INVENTOR(S)   : Han et al.

It is certified that error appears in the above-identified patent and that said Letters Patent is hereby corrected as shown below:

Column 1,
Line 48, insert missing paragraph -- It is another object of the present invention to provide a testing method using the above-described integrated circuit. --;
Line 59, insert missing paragraph -- The integrated circuit further comprises a pulse generator for generating a pulse signal responsive to the data signal, the pulse signal having a width that is substantially the same as width of the row address. --;

Column 4,
Lines 31 to 39, delete paragraph, beginning with "A data generating means..." and ending with "singals Xadd and Yadd.";
Line 48, insert missing paragraph -- The data generating means 400 includes a data register 410 and a write driver 420. The data register 410 generates a data signal DAT having alternating logic high and low transitions responsive to the clock signal CLK. The write driver 420 drives the data signal DAT and provides the data signal DAT to the data input and output line pair SDL and /SDL (refer also to Fig. 3). --.

Signed and Sealed this

Twenty-ninth Day of April, 2003

JAMES E. ROGAN
*Director of the United States Patent and Trademark Office*